(12) United States Patent
Russell et al.

(10) Patent No.: US 6,218,732 B1
(45) Date of Patent: Apr. 17, 2001

(54) COPPER BOND PAD PROCESS

(75) Inventors: Stephen W. Russell; Jiong-Ping Lu, both of Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/354,510

(22) Filed: Jul. 15, 1999

Related U.S. Application Data

(60) Provisional application No. 60/100,335, filed on Sep. 15, 1998.

(51) Int. Cl.$^7$ .......................... H01L 23/48; H01L 23/52; H01L 29/40
(52) U.S. Cl. ...................... 257/748; 257/784; 257/762; 438/687
(58) Field of Search ................................. 257/748, 751, 257/758; 252/762, 784; 438/687

(56) References Cited

U.S. PATENT DOCUMENTS

| | | | |
|---|---|---|---|
| 4,827,326 | * 5/1989 | Altman et al. | 257/762 |
| 5,365,112 | * 11/1994 | Ohshima | 257/784 |
| 6,013,571 | * 1/2000 | Morrell | 438/612 |

FOREIGN PATENT DOCUMENTS

2184288 * 6/1986 (GB) ................................. 257/762

* cited by examiner

*Primary Examiner*—Eddie C. Lee
*Assistant Examiner*—Jhihan B. Clark
(74) *Attorney, Agent, or Firm*—Jacqueline J. Garner; W. James Brady, III; Frederick J. Telecky, Jr.

(57) ABSTRACT

An integrated circuit utilizing copper wiring has copper bond pads which are covered with a passivation layer to prevent unwanted reactions of the copper with metals which are bonded to it. The passivation layer can be an intermetallic of copper and titanium or a stacked layer of CuTix/TiN. Various nitrides can also be used, such as tungsten nitride, tantalum nitride, titanium silicon nitride, tungsten silicon nitride, and tantalum silicon nitride.

11 Claims, 1 Drawing Sheet

COPPER BOND PAD PROCESS

This application claims priority under 35 USC §119(e)(1) of provisional application Ser. No. 60/100,335 filed Sep. 15, 1998.

BACKGROUND AND SUMMARY OF THE INVENTION

The present invention relates to integrated circuit structures and fabrication methods, and especially to the packaging of integrated circuits which use copper metallization.

Background: External Connections for Chip

After an integrated circuit is fabricated, external connections must be formed before the chip is embedded in plastic for protection. With aluminum wiring, which has been the standard for many years, the upper level of wiring for the chip would include bond pads with necessary connections to the underlying circuit. After the protective overcoat (PO) layer is deposited over the chip, holes are etched through the PO to provide access to the bond pads. Depending on the type of packaging used, external connections from the chip can then be made by thin wires which are typically ultrasonically bonded to the bond pad, or by the formation of solder balls which make a direct connection between the bond pad on the chip and the external connector.

However, as device sizes shrink, more and more chip manufacturers are looking to copper to provide the increasingly tiny wiring. One problem which has been encountered is that it is not currently possible to bond directly to the copper bond pad. Copper, unlike aluminum, does not form a self-passivating oxide. When aluminum or gold wires are bonded to the copper, intermetallics are formed which are more resistive and which expand volumetrically, causing cracks and lowering reliability. One solution to this has been to form a barrier layer over the copper bond pad, followed by a layer of aluminum, which can then be bonded to with known methods.

Diffusion Barrier Over Copper Bond Pad

The present application discloses forming a passivation layer over the copper bond pad, using one of several compounds described below. This passivation layer forms a hard, chemically inert layer that prevents the reaction of copper with the metals which are bonded to it without the degradation of the connection which might otherwise occur.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview

Figure 1A:
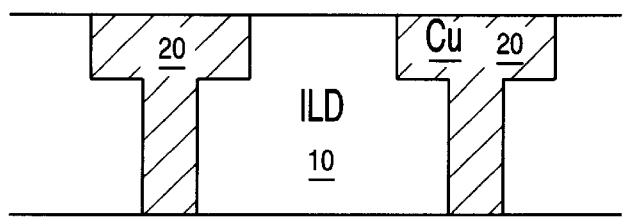
FIGS. 1a–d show various steps in the formation of a copper bonding pad which uses the disclosed diffusion barrier.
Figure 1B:
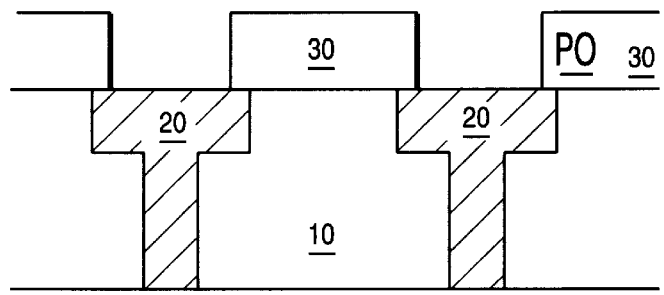

The process takes place during formation of the upper level of copper metallization, shown in FIGS. 1a–d. After deposition of the interlevel dielectric 10, a patterned etch is used to form the trenches in the dielectric for all wiring desired on this level, including the desired bond pads. Another patterned etch forms the vias to lower wiring levels. Copper is then deposited to over-fill the vias and trenches, and excess copper is removed, e.g. by chemical-mechanical polishing, to form the wiring, including bond pads 20, as seen in FIG. 1a.

Next, a protective overcoat (PO) layer 30 is formed, e.g. 200–300 nm of a high-density plasma chemical vapor deposited (HDPCVD) silicon nitride. A patterned etch is performed to open holes through the overcoat layer to expose the bond pads for external connections, giving the structure shown in FIG. 1b.

Finally, a passivation layer is formed in the openings through the protective overcoat. Depending on the specific process used, this may be a self-aligning step, or may require a polish step to remove excess material. The passivation layer can be a single layer, or can comprise multiple layers which give the protection needed.

Once the passivation layer is completed, the bond pads are ready to receive the external connections, be they wire bonding or solder ball bonding.

First Embodiment: CuTix as Passivation Layer

In a first embodiment, after exposing the bond pads through the protective overcoat, a thin layer of titanium (Ti) is deposited to a depth of approximately 10–60 nm thick over the surface. During an anneal, the titanium reacts with the copper to form CuTix, an inert intermetallic which will prevent further reaction of the copper. After the anneal, the unreacted titanium is removed from the surface of the chip.

Second Embodiment: CuTix 40/TiN 50 as Passivation Layer

Figure 1C:
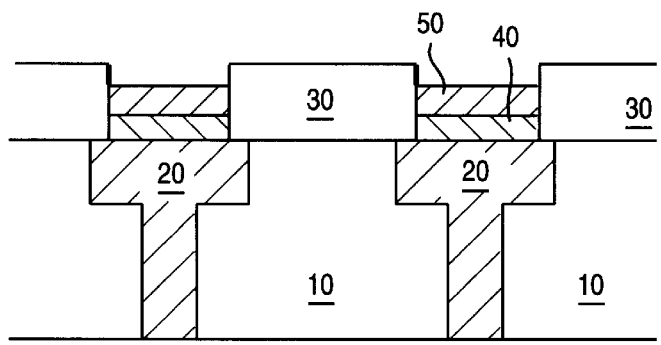
Figure 1D:
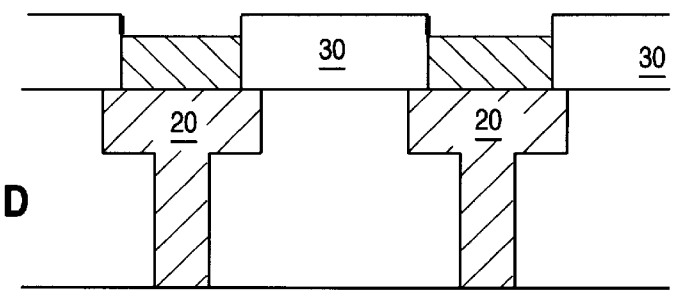

In the presently preferred embodiment, after deposition of titanium, the chip is exposed to an ambient which contains either nitrogen or ammonia. During the anneal, the upper surface of the titanium will react with the nitrogen present to form a layer of TiN while the lower surface of the titanium reacts with the copper to form CuTix. After the unreacted titanium is removed from the surface of the chip, FIG. 1c shows the resulting structure.

Third Embodiment: Deposition of TiN for Passivation

In an further alternate embodiment, a layer of TiN is deposited over the chip, overfilling the holes through the PO. A chemical-mechanical polish step removes excess material outside of the holes, giving the structure shown in FIG. 1d.

Fourth Embodiment: Other Passivation Materials

In addition to the materials mentioned, other passivation materials can be used to prevent reaction of the copper and aluminum, such as tungsten nitride, tantalum nitride, titanium silicon nitride, tungsten silicon nitride, and tantalum silicon nitride. Like TiN, these materials will fill the holes through the protective overcoat, with the excess being polished off by CMP.

According to a disclosed class of innovative embodiments, there is provided: A bond pad structure for an integrated circuit, said bond pad structure comprising: a first layer primarily comprising copper, having connections to underlying circuitry, said first layer being partially overlain by a protective overcoat layer; a passivation layer, overlying said first layer, which prevents said copper from reacting with materials which are bonded to said bond pad structure.

According to another disclosed class of innovative embodiments, there is provided: A fabrication methodA fabrication method, comprising the steps of: (a.) forming an integrated circuit structure having a copper metallization layer; (b.) forming a protective overcoat layer which partially overlies said copper metallization layer; (c.) forming a passivation layer over portions of said copper metallization layer exposed under said protective overcoat layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. A bond pad structure for an integrated circuit, said bond pad structure comprising:
   a first layer primarily comprising copper, having connections to underlying circuitry, said first layer being partially overlain by a protective overcoat layer;
   a passivation layer, directly overlying only said first layer, which prevents said copper from reacting with materials which are bonded to said bond pad structure.

2. The integrated circuit of claim 1, wherein said passivation layer comprises titanium.

3. The integrated circuit of claim 1, wherein said passivation layer comprises titanium nitride.

4. The integrated circuit of claim 1, further comprising a wire bonded to said passivation layer.

5. A fabrication method, comprising the steps of:
   (a.) forming an integrated circuit structure having a copper metallization layer;
   (b.) forming a protective overcoat layer which partially overlies said copper metallization layer;
   (c.) forming a passivation layer directly over only portions of said copper metallization layer exposed under said protective overcoat layer.

6. The method of claim 5, wherein said passivation layer comprises titanium.

7. The method of claim 5, further comprising bonding a wire to said passivation layer.

8. A fabrication method, comprising the steps of:
   (a.) forming an integrated circuit structure having a copper metallization layer;
   (b.) forming a protective overcoat layer which partially overlies said copper metallization layer;
   (c.) forming a passivation layer over portions of said copper metallization layer exposed under said protective overcoat layer by
      (1) depositing a layer of titanium over said copper metallization;
      (2) annealing said layer of titanium to react with the copper metallization to form $CuTi_x$; and
      (3) removing any unreacted portions of said titanium layer.

9. The fabrication method of claim 8, wherein said annealing step is conducted in a nitrogen-containing ambient and forms a layer of TiN over said $CuTi_x$.

10. The fabrication method of claim 8, further comprising the step of bonding a wire to said passivation layer.

11. The fabrication method of claim 8, further comprising the step of forming solder balls on said passivation layer.

* * * * *